United States Patent
Harris et al.

(10) Patent No.: US 6,525,358 B2
(45) Date of Patent: Feb. 25, 2003

(54) CAPACITOR HAVING THE LOWER ELECTRODE FOR PREVENTING UNDESIRED DEFECTS AT THE SURFACE OF THE METAL PLUG

(75) Inventors: Edward Belden Harris, Orlando, FL (US); Sailesh Mansinh Merchant, Orlando, FL (US); Yifeng Winston Yan, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/951,178

(22) Filed: Sep. 13, 2001

(65) Prior Publication Data

US 2002/0074586 A1 Jun. 20, 2002

Related U.S. Application Data

(62) Division of application No. 09/408,299, filed on Sep. 29, 1999, now Pat. No. 6,323,044.
(60) Provisional application No. 60/115,532, filed on Jan. 12, 1999.

(51) Int. Cl.[7] .................. H01L 29/76; H01L 29/94; H01L 31/062; H01L 31/113; H01L 31/119
(52) U.S. Cl. .............. 257/295; 257/303; 257/306
(58) Field of Search .................. 257/303, 306, 257/310, 295, 296; 438/3, 240, 239, 253, 387, 396

(56) References Cited

U.S. PATENT DOCUMENTS

| 5,005,102 A | | 4/1991 | Larson ............... 257/295 |
| 5,216,572 A | | 6/1993 | Larson et al. ........... 257/295 |
| 5,508,953 A | * | 4/1996 | Fukuda et al. .......... 257/295 |
| 5,903,493 A | | 5/1999 | Lee ..................... 365/149 |
| 5,929,475 A | * | 7/1999 | Uemoto et al. .......... 257/295 |
| 6,177,305 B1 | | 1/2001 | Hornback et al. ........ 438/240 |
| 6,180,974 B1 | | 1/2001 | Okutoh et al. ........... 257/306 |
| 6,214,660 B1 | | 4/2001 | Uemoto et al. .......... 438/240 |
| 6,255,688 B1 | * | 7/2001 | Lee et al. ............... 257/306 |

FOREIGN PATENT DOCUMENTS

| JP | 404360506 A | 12/1992 |
| JP | 407030074 A | 1/1995 |

* cited by examiner

Primary Examiner—Olik Chaudhuri
Assistant Examiner—Hoai Pham

(57) ABSTRACT

An integrated circuit capacitor includes a metal plug in a dielectric layer adjacent a substrate. The metal plug has at least one topographical defect in an uppermost surface portion thereof. A lower metal electrode overlies the dielectric layer and the metal plug. The lower metal electrode includes, in stacked relation, a metal layer, a lower metal nitride layer, an aluminum layer, and an upper metal nitride layer. A capacitor dielectric layer overlies the lower metal electrode, and an upper metal electrode: overlies the capacitor dielectric layer. An advantage of this structure is that the stack of metal layers of the lower metal electrode, will prevent undesired defects at the surface of the metal plug from adversely effecting device reliability or manufacturing yield.

16 Claims, 4 Drawing Sheets

US 6,525,358 B2

CAPACITOR HAVING THE LOWER ELECTRODE FOR PREVENTING UNDESIRED DEFECTS AT THE SURFACE OF THE METAL PLUG

This application is a divisional of Ser. No. 09/408,299 filed on Sep. 29, 1999 now U.S. Pat No. 6,323,044, which is based upon application Ser. No. 60/115,532, filed Jan. 12, 1999, the disclosures of which are hereby incorporated by reference in their entirety.

RELATED APPLICATION

This application is based upon prior filed copending provisional application Ser. No. 60/115,532 filed Jan. 12, 1999.

FIELD OF THE INVENTION

The present invention relates to the field of semiconductor devices, and, more particularly, to a capacitor.

BACKGROUND OF THE INVENTION

Capacitors are used extensively in electronic devices for storing an electric charge. A capacitor includes two conductive plates or electrodes separated by an insulator. The capacitance, or amount of charge held by the capacitor per applied voltage, depends upon the area of the plates, the distance between them, and the dielectric value of the insulator. Capacitors may be formed within a semiconductor device, such as, for example, a dynamic random access memory (DRAM) or an embedded DRAM.

As semiconductor memory devices become more highly integrated, the area occupied by the capacitor of a DRAM storage cell is reduced, thus decreasing the capacitance of the capacitor due to a smaller electrode surface area. However, a relatively large capacitance is desired to prevent loss of stored information. Therefore, it is desirable to reduce the cell dimensions and yet obtain a high capacitance, which achieves both high cell integration and reliable operation.

Instead of forming the capacitor on the substrate surface, capacitors are also formed above the substrate, i.e., they are stacked above the substrate. The surface area of the substrate can then be used for forming transistors. For example, U.S. Pat. No. 5,903,493 to Lee discloses a capacitor formed above a tungsten plug. The tungsten plug interfaces with an interconnection line, thus allowing different layers formed above the substrate to be connected. Such plugs may be anchored or tapered to secure the plug in the dielectric layer.

Current 0.25 and 0.2 micron semiconductor technology uses metal-oxide-metal (MOM) capacitors that are formed above tungsten plugs. However, these plugs can have surface defects such as seams, recesses, bulges or other topographical features which may cause MOM capacitor reliability and yield problems. For example, when the dielectric adjacent the tungsten plug is polished during a chemical mechanical polishing (CMP) step, the resulting tungsten plug may protrude or bulge upwardly above the dielectric layer.

SUMMARY OF THE INVENTION

In view of the foregoing background, it is therefore an object of the present invention to provide an integrated circuit capacitor with metal electrodes and with increased reliability of the capacitor.

This and other advantages, features and objects in accordance with the present invention are provided by an integrated circuit capacitor including a metal plug in a dielectric layer adjacent a substrate, with the metal plug having at least one topographical defect in an uppermost surface portion thereof. A lower metal electrode overlies the dielectric layer and the metal plug. The lower metal electrode preferably comprises, in stacked relation, a metal layer, a lower metal nitride layer, an aluminum layer, and an upper metal nitride layer. A capacitor dielectric layer overlies the lower metal electrode, and an upper metal electrode overlies the capacitor dielectric layer. An advantage of this structure is that the stack of metal layers of the lower metal electrode, will prevent undesired defects at the surface of the metal plug from adversely effecting device reliability or manufacturing yield. The aluminum and metal nitride layers may also desirably provide an etch stop layer to facilitate manufacturing.

The metal plug preferably comprises tungsten, and the at least one topographical defect may include at least one of a recess, a seam and a bulge. The metal layer of the lower metal electrode preferably comprises a refractory metal such as titanium. Each of the lower and upper metal nitride layers of the lower metal electrode preferably comprises a refractory metal nitride, such as titanium nitride. Also, the upper metal electrode may comprise, in stacked relation, a lower metal nitride layer, an aluminum layer, and an upper metal nitride layer. Each of the lower and upper metal nitride layers of the upper metal electrode may also comprise titanium nitride.

The advantages, features and objects in accordance with the present invention are also provided by a method of making an integrated circuit capacitor including the steps of forming a dielectric layer adjacent a substrate and forming a metal plug in the dielectric layer. The forming of the metal plug creates at least one undesirable topographical defect in an uppermost surface portion of the metal plug. The method further includes the step of forming a lower metal electrode overlying the dielectric layer and the metal plug. The lower metal electrode may comprise, in stacked relation, a metal layer, a lower metal nitride layer, an aluminum layer, and an upper metal nitride layer. A capacitor dielectric layer is formed over the lower metal electrode, and an upper metal electrode is formed over the capacitor dielectric layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in.the art. Like numbers refer to like elements throughout. The dimensions of layers and regions may be exaggerated in the figures for clarity.

Figure 1:
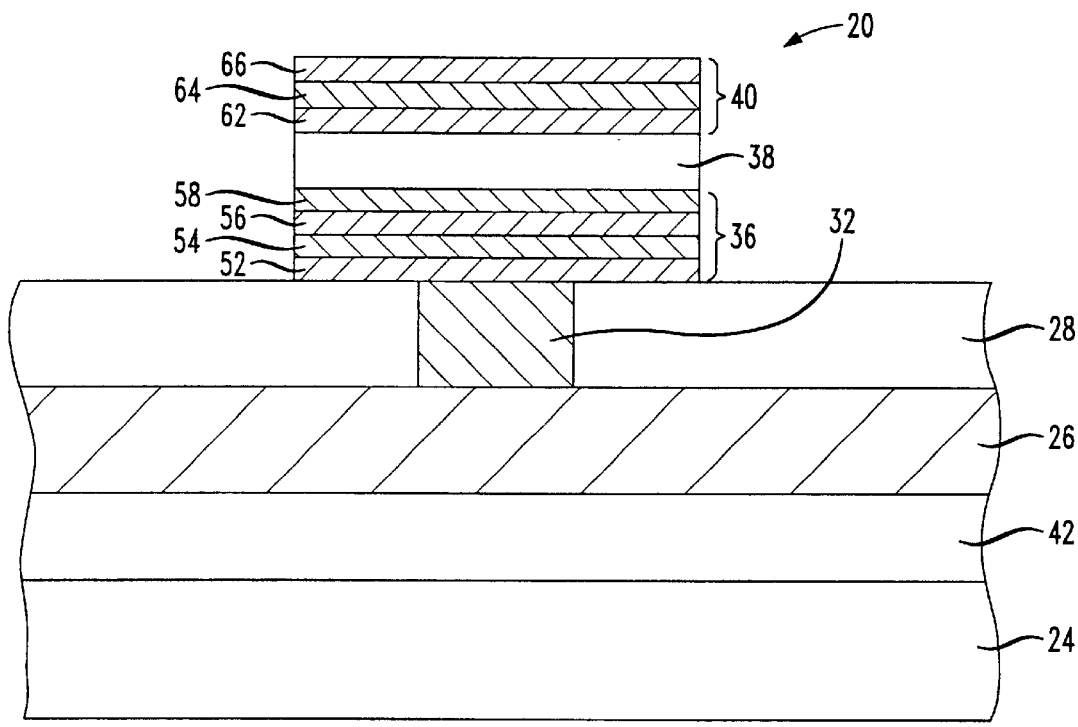
FIG. 1 is a cross-sectional view of an integrated circuit capacitor in accordance with the present invention.

Referring initially to FIG. 1, the integrated circuit MOM capacitor 20 including multilevel metal electrodes 36, 40 above a metal plug 32, is now described. The integrated circuit capacitor 20 is formed above a substrate 24 with an interconnect line 26 adjacent the substrate, and a dielectric layer 28 is on the interconnection line. The plug 32 is disposed in the dielectric layer 28. The capacitor 20 includes lower and upper multilevel metal electrodes 36, 40 and a capacitor dielectric layer 38 therebetween. The lower metal electrode 36 contacts the metal plug 32. The second or capacitor dielectric layer 38 overlies the lower metal electrode 36, and the upper metal electrode 40 overlies the second dielectric layer.

The lower metal electrode 36 includes multiple metal layers 52–58 in stacked relation. The stack includes a first metal layer 52 and preferably is formed of titanium. The first metal nitride layer 54 is preferably formed of a refractory metal nitride, such as titanium nitride. Layer 56 is a first aluminum layer and layer 58 is a second metal nitride layer also preferably formed of titanium nitride. Also, the upper metal electrode 40 also illustratively includes multiple metal layers 62–66 in stacked relation. Layer 62 is a third metal nitride layer and preferably is formed of a refractory metal nitride such as titanium nitride. Layer 64 is a second aluminum layer and layer 66 is a fourth metal nitride layer also preferably formed of titanium nitride.

The capacitor dielectric layer 38 overlies the lower metal electrode 36 and is formed from any suitable dielectric, e.g., silicon dioxide, silicon nitride and/or any material or alloy of material having a suitably large dielectric constant. Other suitable materials include tantalum pentoxide and barium strontium titantate, for example.

As will be described in more detail below, an advantage of this structure is that the stack of metal layers 52–58 of the lower metal electrode 36, will compensate for undesired defects at the surface of the metal plug 32. The stack will increase integrated circuit device yield, reduce MOM capacitor leakage and thus increase the reliability of the MOM capacitor 20. Additionally, as will also be described below, the first aluminum layer 56 and the second metal nitride layer 58 are used as an etch stop when patterning and etching the capacitor dielectric layer 38. Furthermore, the second aluminum layer 64 and the fourth metal nitride layer 66 can be used as an etch stop for a subsequent via etch.

The interconnect line 26 may include a multilayer interconnect formed on an insulating layer 42. The insulating layer 42 is formed on or above the semiconductor substrate 24. The semiconductor substrate 24 may include a plurality of active devices, such as transistors, which are connected together into functional circuits by the interconnect line 26. The multilayer interconnect may include a conductive capping layer, a bulk conductor, and an electromigration barrier layer (not shown) as would readily be appreciated by those skilled in the art. Additionally, an anti-reflective coating (ARC), such as titanium nitride, may be formed on the interconnect line 26.

The integrated capacitor 20 is electrically connected to the interconnect line 26 by the metal plug 32. The metal plug 32 preferably includes tungsten or any suitable, electrically conductive material such as aluminum, titanium or titanium nitride.

Figure 2:
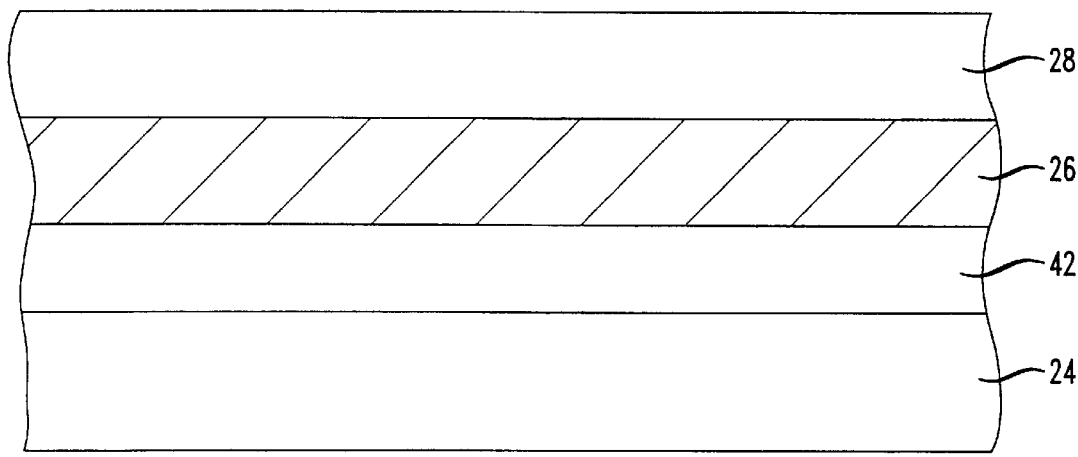
FIGS. 2, 3 and 7–9 are cross-sectional views illustrating the process steps for forming a capacitor in accordance with the present invention.

A method for making the integrated circuit MOM capacitor 20 including the multilevel metal electrodes 36, 40 above a metal plug 32, as described above, will now be further discussed with reference to FIGS. 2–9. Referring to FIG. 2, the semiconductor substrate 24 is preferably silicon, or may be silicon or a polysilicon layer or structure formed on the substrate. A plurality of devices, such as transistors (not shown), are formed in the substrate 24 using well known techniques. Next, the dielectric layer 42, such as a doped or undoped silicon dioxide, is formed over the substrate 24 with well known techniques, such as thermal growth or deposition.

Next, the interconnection line 26 is formed on the dielectric layer 42. As an example, an approximately 450 nm thick aluminum alloy layer comprising approximately 1% copper may be formed on a titanum layer using well known techniques, such as sputtering. An aluminum alloy layer has low resistivity and is readily procured; however, other low resistance materials may be used as a bulk conductor in the interconnect line 26, as will be appreciated by those skilled in the art. As discussed above, the interconnect line 26 may be a multilayer interconnect as would readily be appreciated by those skilled in the art. Additionally, an anti-reflective coating (ARC), such as titanium nitride, may be formed on the interconnect line 26.

Figure 3:
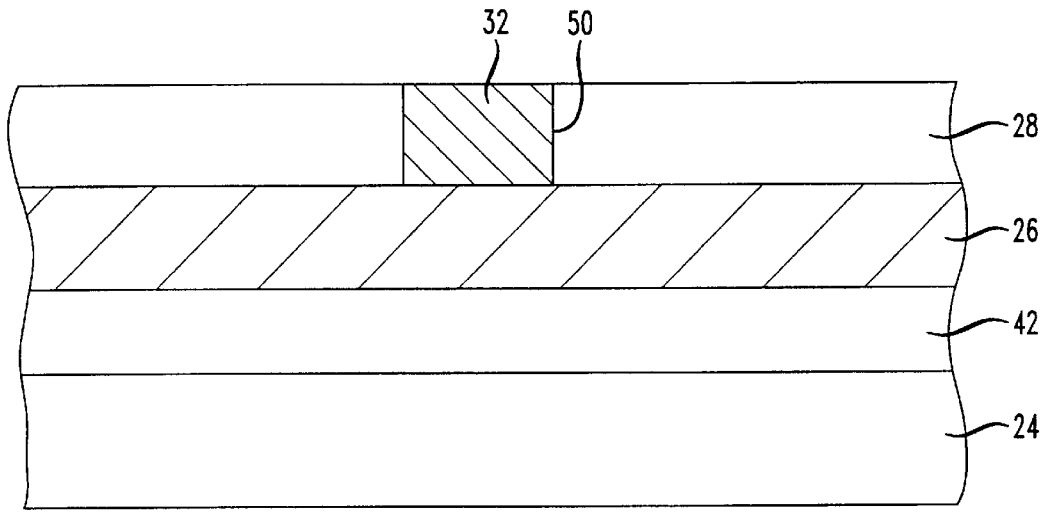

The dielectric layer 28, such as a doped silicon dioxide, is formed over the interconnect line 26. Any well known technique can be used to form the dielectric layer 28, such as chemical vapor deposition (CVD). Referring to FIG. 3, a photoresist layer (not shown) is formed and patterned over the dielectric layer 28 using well known photolithography techniques to define the location where a via hole 50 is to be formed. Next, the exposed portions of the dielectric layer 28 are etched. The via hole 50 is etched until the interconnect line 26 is exposed. In one embodiment, a directional reactive ion etch (RIE) is used to form the via hole 50. The via hole 50 could be etched using standard etch conditions. Typical etchants are $C_4F_8/CO/Ar/O_2$ mixtures.

The via hole 50 is filled with a conductive material, preferably tungsten, using well known techniques for forming the metal plug 32. Prior to forming the plug 32, a nucleation layer, such as titanium nitride or tantalum nitride, may be sputter deposited on the side walls of the via hole 50, as would be appreciated by those skilled in the art. Also, a thin adhesion/barrier layer, such as titanium or titanium nitride can be blanket deposited into the via hole 50 using well known techniques such as sputtering. The conductive material is deposited into the via hole 50 until the via hole 50 is filled. A chemical-mechanical polishing technique may be used to etch back the adhesion/barrier metals and any conductive material deposited on the dielectric layer 28. Alternatively, a metal layer may be deposited on the interconnect line 26 and then patterned and etched to form the metal plug 32. Here, the dielectric layer 28 would then be formed over the metal plug 32.

The dielectric layer 28 is preferably planarized at this time by chemical-mechanical polishing or etch back to form a planar top surface. The resulting thickness of the dielectric layer 28 should be thick enough after planarization to provide adequate electrical isolation of the interconnect line 26 from a subsequent level of metallization. For example, an approximate thickness of 400 to 600 nm provides suitable isolation.

Figure 4:
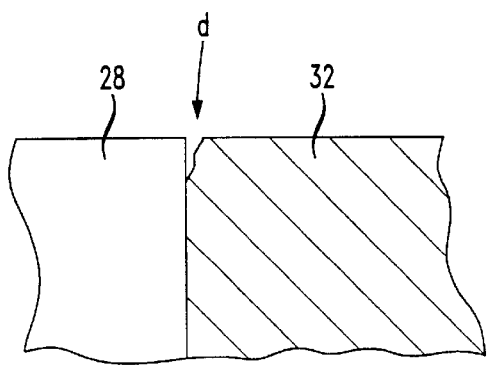
FIGS. 4–6 are enlarged cross-sectional views illustrating examples of possible defects in the surface of the metal plug of the capacitor in accordance with the present invention.
Figure 5:
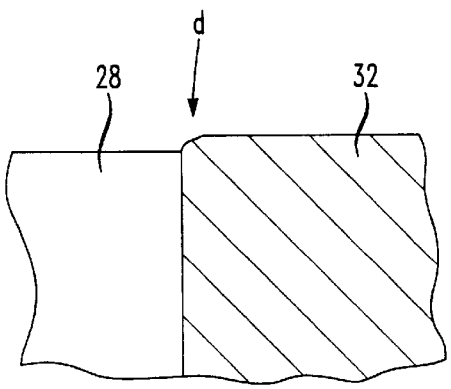
Figure 6:
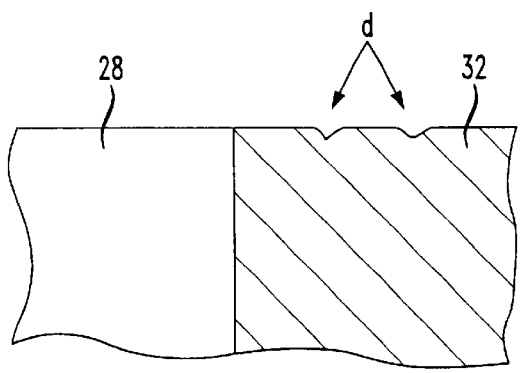

Referring now to FIGS. 4–6, after the formation of the metal plug 32 and the dielectric layer 28, defects d may be exist at the surface of the metal plug 32. For example, as shown in FIGS. 4 and 6, a seam or recess d may exist at the boundary of the metal plug 32 and the dielectric layer 28. As illustrated in FIG. 5, a bulge or hump d may be formed at the boundary of the metal plug 32 and the dielectric layer 28 from over polishing of the dielectric layer 28. These defects such as seams, recesses, bulges or other topographical features would typically cause MOM capacitor reliability and yield problems.

Figure 7:
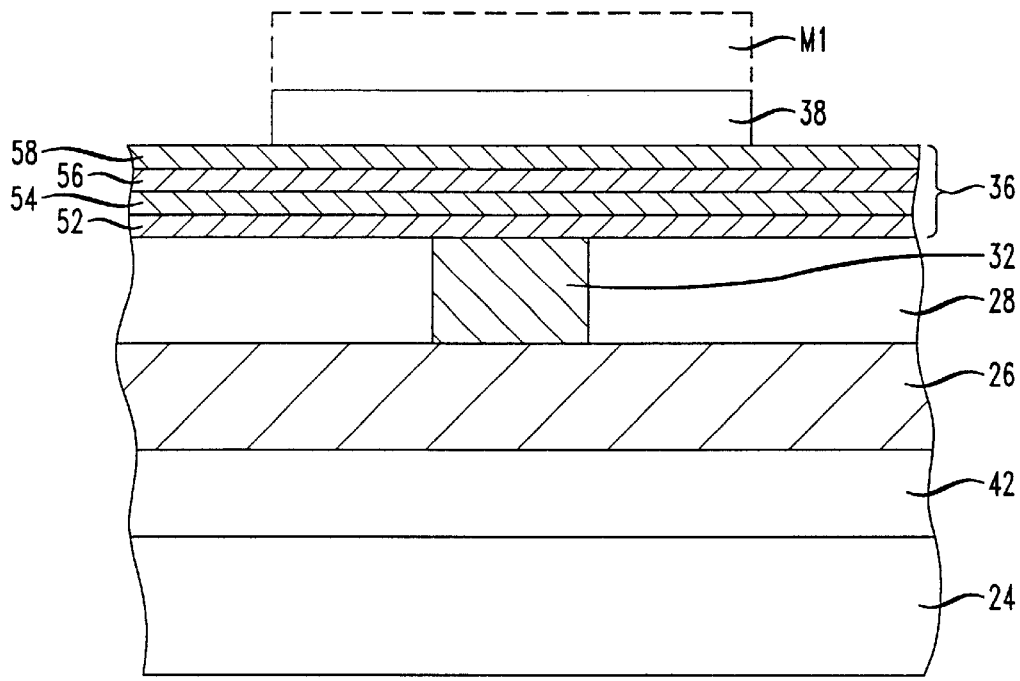

The lower metal electrode 36 of the capacitor 20 is formed by depositing electrically conductive metal layers 52–58 on the dielectric layer 28 and the metal plug 32, as illustrated in FIG. 7. The lower metal electrode 36 is selectively formed by an appropriate technique, such as chemical vapor deposition (CVD). Other methods of depositing the lower metal electrode 36 may include sputtering, reactive sputter etching (RSE), and plasma enhanced chemical vapor deposition (PECVD). The lower electrode 36 includes multiple metal layers 52–58 in stacked relation to each other. Layer 52 acts as a seed layer and is a first metal layer preferably formed of titanium. Layer 54 is a first metal nitride layer and preferably is formed of a refractory metal nitride such as titanium nitride. Layer 56 is a first aluminum layer and layer 58 is a second metal nitride layer also preferably formed of titanium nitride.

The capacitor dielectric layer 38 is selectively formed over the lower metal electrode 36 using an appropriate technique. The capacitor dielectric layer 38 may be deposited using CVD or any of the other techniques referenced with respect to depositing the lower metal electrode 36. As shown in FIG. 7, a photoresist layer or mask M1 is formed and patterned over the capacitor dielectric layer 38 using well known photolithography techniques before an etching step is performed. The first aluminum layer 56 and the second metal nitride layer 58 are used as an etch stop when patterning and etching the capacitor dielectric layer 38.

Figure 8:
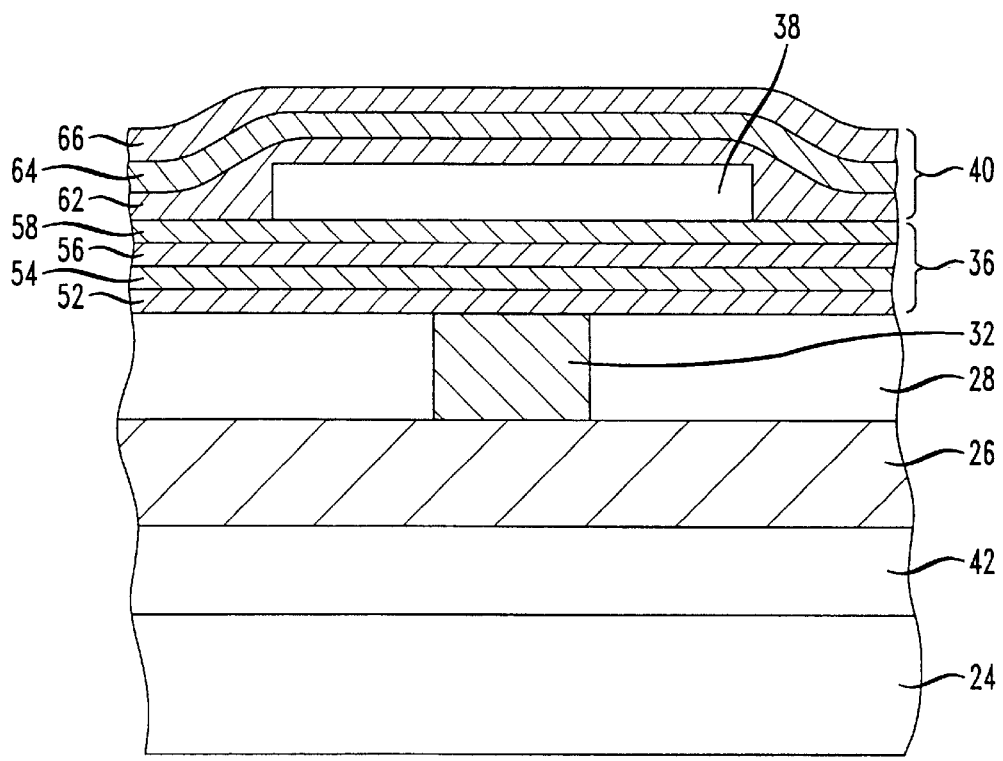

Referring to FIG. 8, the upper metal electrode 40 is then deposited by CVD, for example. Other methods of depositing the upper metal electrode 40 include physical vapor deposition (PVD), sputtering, reactive sputter etching (RSE), and plasma enhanced chemical vapor deposition (PECVD). The upper metal electrode 40 includes multiple metal layers 62–66 formed in stacked relation. Layer 62 is a third metal nitride layer and preferably is formed of a refractory metal nitride, such as titanium nitride. Layer 64 is a second aluminum layer and layer 66 is a fourth metal nitride layer also preferably formed of titanium nitride. Here, the second aluminum layer 64 is relatively thinner that the first aluminum layer 56 of the lower metal electrode 36. The second aluminum layer 64 and the fourth metal nitride layer 66 of the second metal electrode 40 act as an etch stop for a subsequent via etch.

Figure 9:
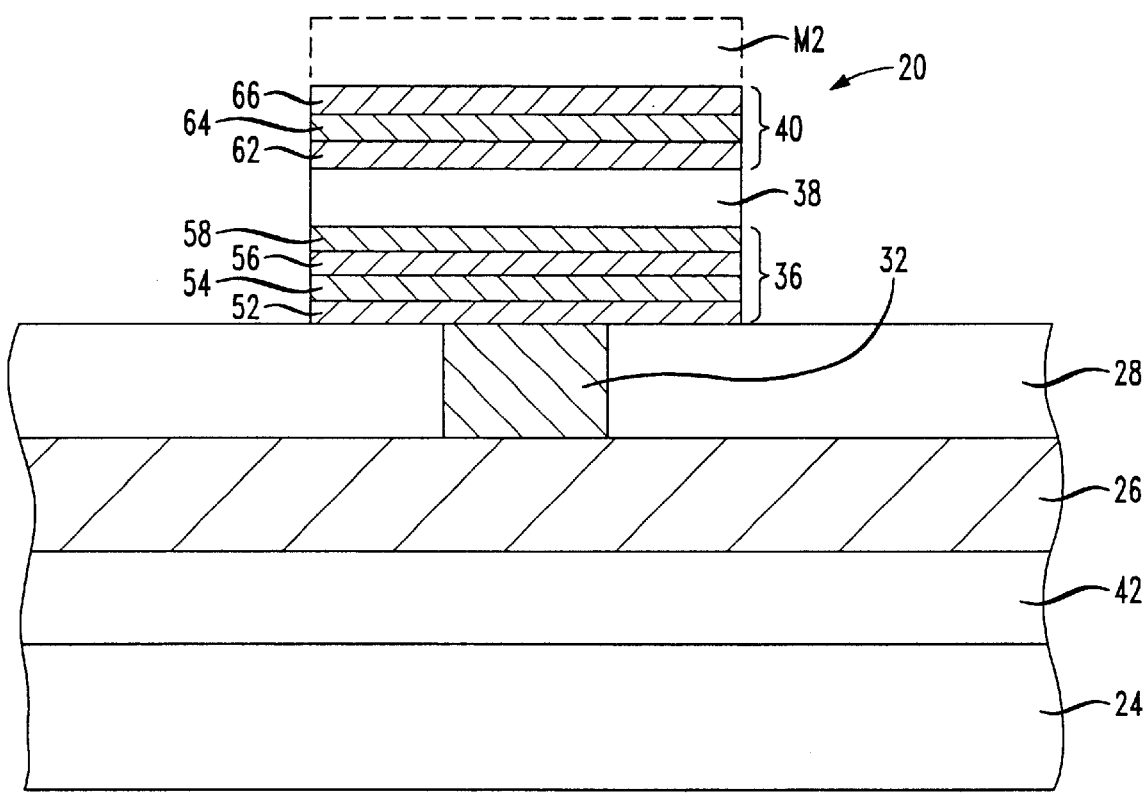

As shown in FIG. 9, the multilevel metal electrodes 36 and 40 are patterned with a photoresist layer or mask M2 formed over the stack of metal layers 52–58, 62–66 using well known photolithography techniques. The multilevel metal electrodes 36 and 40 are then etched to form the capacitor 20. The MOM capacitor 20 thus includes the lower and upper electrodes 36, 40 and the second dielectric layer 38 therebetween, as shown in FIG. 1.

An advantage of this method is that the stack of metal layers 52–58 of the lower metal electrode 36, will compensate for defects d at the surface of the metal plug 32. This will increase device yield, reduce MOM capacitor leakage and thus increase the reliability of the MOM capacitor 20. Additionally, as described, the first aluminum layer 56 and the second metal nitride layer 58 can be used as an etch stop when patterning and etching the capacitor dielectric layer 38. Furthermore, the second aluminum layer 64 and the fourth metal nitride layer 66 can be used as an etch stop for a subsequent via etch.

In another embodiment, after the capacitor dielectric layer 38 is deposited as described above with reference to FIG. 7, the stack of metal layers 62–66 of the upper metal electrode 40 are deposited over the capacitor dielectric 38 and the lower electrode 36. The stack of metal layers 62–66 of the upper metal electrode 40 are then patterned and etched using the capacitor dielectric layer 38 as an etch stop. Then the capacitor dielectric layer 38 and the stack of metal layers 52–58 of the lower metal electrode 36 are patterned and etched. Here, the second aluminum layer 64 may have about the same thickness as the first aluminum layer 56.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit capacitor comprising:

a substrate;

a dielectric layer adjacent the substrate;

a metal plug in the dielectric layer, the metal plug having at least one topographical defect in an uppermost surface portion thereof;

a lower metal electrode overlying the dielectric layer and the metal plug, the lower metal electrode comprising, in stacked relation, a metal layer, a lower metal nitride layer, an aluminum layer, and an upper metal nitride layer;

a capacitor dielectric layer overlying the lower metal electrode; and an upper metal electrode overlying the capacitor dielectric layer.

2. An integrated circuit capacitor according to claim 1, wherein the metal plug comprises tungsten.

3. An integrated circuit capacitor according to claim 1, wherein the at least one topographical defect includes at least one of a recess, a seam and a bulge.

4. An integrated circuit capacitor according to claim 1, wherein the metal layer of the lower metal electrode comprises a refractory metal.

5. An integrated circuit capacitor according to claim 1, wherein the metal layer of the lower metal electrode comprises titanium.

6. An integrated circuit capacitor according to claim 1, wherein each of the lower and upper metal nitride layers of the lower metal electrode comprises a refractory metal nitride.

7. An integrated circuit capacitor according to claim 1, wherein each of the lower and upper metal nitride layers of the lower metal electrode comprises titanium nitride.

8. An integrated circuit capacitor according to claim 1, wherein the upper metal electrode comprises, in stacked relation, a lower metal nitride layer, an aluminum layer, and an upper metal nitride layer.

9. An integrated circuit capacitor according to claim 8, wherein each of the lower and upper metal nitride layers of the upper metal electrode comprises titanium nitride.

10. An integrated circuit capacitor according to claim 1, further comprising an interconnection line extending below the dielectric layer and connected to the metal plug.

11. An integrated circuit capacitor according to claim 1, wherein the uppermost surface portion of the metal plug is substantially co-planar with an adjacent uppermost surface of the dielectric layer.

12. An integrated circuit capacitor comprising:
a substrate;
a dielectric layer adjacent the substrate;
a metal plug in the dielectric layer;
a lower metal electrode overlying the dielectric layer and the metal plug, the lower metal electrode comprising, in stacked relation, a titanium layer, a lower titanium nitride layer, an aluminum layer, and an upper titanium nitride layer;
a capacitor dielectric layer overlying the lower metal electrode; and
an upper metal electrode overlying the capacitor dielectric layer, the upper metal electrode comprising aluminum.

13. An integrated circuit capacitor according to claim 12, wherein the metal plug comprises tungsten.

14. An integrated circuit capacitor according to claim 12, wherein the metal plug has at least one topographical defect in an uppermost surface portion thereof, the at least one topographical defect including at least one of a recess, a seam and a bulge.

15. An integrated circuit capacitor according to claim 12, wherein the upper metal electrode comprises, in stacked relation, a lower metal nitride layer, an aluminum layer, and an upper metal nitride layer.

16. An integrated circuit capacitor according to claim 15, wherein each of the lower and upper metal nitride layers of the upper metal electrode comprises titanium nitride.

* * * * *